(12) United States Patent
Kim et al.

(10) Patent No.: US 12,439,697 B2
(45) Date of Patent: *Oct. 7, 2025

(54) DISPLAY DEVICE

(71) Applicant: Samsung Display Co., LTD., Yongin-si (KR)

(72) Inventors: Hyung Jun Kim, Seoul (KR); So Young Koo, Hwaseong-si (KR); Eok Su Kim, Seoul (KR); Yun Yong Nam, Hwaseong-si (KR); Jun Hyung Lim, Seoul (KR); Kyung Jin Jeon, Incheon (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/610,416

(22) Filed: Mar. 20, 2024

(65) Prior Publication Data

US 2024/0234431 A1     Jul. 11, 2024

Related U.S. Application Data

(63) Continuation of application No. 17/398,566, filed on Aug. 10, 2021, now Pat. No. 11,942,482.

(30) Foreign Application Priority Data

Dec. 1, 2020 (KR) ........................ 10-2020-0165906

(51) Int. Cl.
*H01L 27/12* (2006.01)
*H10D 30/67* (2025.01)
(Continued)

(52) U.S. Cl.
CPC ......... *H10D 86/60* (2025.01); *H10D 30/6755* (2025.01); *H10D 30/6757* (2025.01); *H10D 86/423* (2025.01); *H10K 59/1201* (2023.02)

(58) Field of Classification Search
CPC ... H01L 23/291; H01L 23/29; H01L 23/4825; H01L 25/0753; H01L 25/075;
(Continued)

(56) References Cited

U.S. PATENT DOCUMENTS

| | | |
|---|---|---|
| 10,453,965 B2 | 10/2019 | Yamaguchi et al. |
| 11,177,363 B2 | 11/2021 | Yamaguchi et al. |

(Continued)

FOREIGN PATENT DOCUMENTS

| | | |
|---|---|---|
| JP | 2018-170324 | 11/2018 |
| KR | 10-2015-0126509 | 11/2015 |

(Continued)

OTHER PUBLICATIONS

US 9,548,396 B2, 01/2017, Yamazaki (withdrawn)
(Continued)

*Primary Examiner* — Nikolay K Yushin
(74) *Attorney, Agent, or Firm* — Innovation Counsel LLP

(57) ABSTRACT

A display device according to an embodiment includes a light blocking layer disposed on a substrate; an oxygen supply layer disposed on and contacting the light blocking layer; a semiconductor layer disposed on the oxygen supply layer; and a light emitting diode electrically connected with the semiconductor layer. The semiconductor layer includes an oxide semiconductor, and the oxygen supply layer includes a metal oxide that includes at least one of indium, zinc, gallium, and tin.

16 Claims, 19 Drawing Sheets

(51) Int. Cl.
*H10D 86/40* (2025.01)
*H10D 86/60* (2025.01)
*H10K 59/12* (2023.01)

(58) Field of Classification Search
CPC ..... H01L 25/16; H01L 25/50; H01L 27/1225; H01L 27/12; H01L 27/156; H01L 27/15; H01L 27/1259; H01L 29/7869; H01L 29/786; H01L 29/78696; H01L 29/78612; H01L 29/78621; H01L 29/4908; H01L 29/49; H01L 29/78633; H10K 9/1201; H10K 59/12; H10K 59/126; H10K 59/1201; H10D 86/60; H10D 86/423; H10D 86/40; H10D 86/021; H10D 86/01; H10D 30/6755; H10D 30/67; H10D 30/6757; H10D 30/6708; H10D 30/6715; H10D 30/6723; H10D 30/6739; H10H 20/854; H10H 20/855; H10H 20/85; H10H 29/142; H10H 29/14; H10H 29/30; H10H 29/10

See application file for complete search history.

(56) References Cited

U.S. PATENT DOCUMENTS

2018/0286888 A1 10/2018 Yamaguchi et al.
2018/0350994 A1 12/2018 Hosaka et al.

FOREIGN PATENT DOCUMENTS

KR  10-2017-0080938  7/2017
KR  10-2070762       1/2020
KR  10-2089468       3/2020

OTHER PUBLICATIONS

Rongsheng Chen et al., "Self-aligned top-gate InGaZnO thin film transistors using SiO2/Al2O3 stack gate dielectric", Thin Solid Films, Sep. 17, 2013, pp. 572-575, vol. 548.

Korean Office Action dated Dec. 18, 2024, in Korean Patent Application No. 10-2020-0165906.

DISPLAY DEVICE

CROSS-REFERENCE TO RELATED APPLICATION(S)

This is a continuation application of U.S. patent application Ser. No. 17/398,566 filed Aug. 10, 2021, now U.S. Pat. No. 11,942,482, which issued on Mar. 26, 2024, the disclosure of which is incorporated herein by reference in its entirety. U.S. patent application Ser. No. 17/398,566 claims priority to and the benefit of Korean Patent Application No. 10-2020-0165906 under 35 U.S.C. § 119, filed in the Korean Intellectual Property Office on Dec. 1, 2020, the entire contents of which are incorporated herein by reference.

BACKGROUND

1. Technical Field

The disclosure relates to a display device and a manufacturing method of the display device, and more particularly, it relates to a display device that includes an oxygen supply layer, and a method for manufacturing the same.

2. Description of Related Art

A display device including a thin film transistor has been commercially available. The thin film transistor includes a gate electrode, a semiconductor layer, a source electrode, and a drain electrode. The thin film transistor may have a structure in which the semiconductor layer is disposed on the gate electrode or a structure in which the gate electrode is disposed on the semiconductor layer depending on electrode arrangement structures.

In case that the gate electrode is disposed on the semiconductor layer, the semiconductor layer is exposed directly to light incident from a lower portion of a substrate. Thus, light leakage current may occur in the semiconductor layer, and a technical problem such as crosstalk may occur. In order to prevent this, a light blocking layer may be provided in a lower portion of the semiconductor layer.

Recently, an oxide semiconductor has been used. Oxygen defects exist inside the oxide semiconductor, and these oxygen defects act as carriers so that they can operate similar to a conductor rather than a semiconductor.

The above information disclosed in this Background section is only for enhancement of understanding of the background of the invention, and therefore it may contain information that does not form the prior art that is already known in this country to a person of ordinary skill in the art.

SUMMARY

Embodiments are to provide a display device including an oxygen supply layer, and a method for manufacturing the same.

A display device according to an embodiment may include a light blocking layer disposed on a substrate; an oxygen supply layer disposed on and contacting the light blocking layer; a semiconductor layer disposed on the oxygen supply layer; and a light emitting diode electrically connected with the semiconductor layer. The semiconductor layer may include an oxide semiconductor, and the oxygen supply layer includes a metal oxide that includes at least one of indium, zinc, gallium, and tin.

A thickness of the oxygen supply layer may be in a range of about 30% to about 50% of a thickness of the semiconductor layer.

The oxygen supply layer and the semiconductor layer may include a same material.

the oxygen supply layer and the light blocking layer may have a same planar shape.

A planar shape of the oxygen supply layer may be different from a planar shape of the light blocking layer.

At least a part of the light blocking layer may not overlap the oxygen supply layer in a direction that is perpendicular to a surface of the substrate.

The display device may further include a gate insulating layer disposed on the semiconductor layer; and a gate electrode disposed on the gate insulating layer.

The semiconductor layer and the oxygen supply layer may include an IGZO.

A display device according to another embodiment may include a light blocking layer that is disposed on a substrate; a first oxygen supply layer disposed on and contacting the light blocking layer; a semiconductor layer disposed on the first oxygen supply layer; a gate insulating layer disposed on the semiconductor layer; a second oxygen supply layer disposed on the gate insulating layer; a gate electrode disposed on the second oxygen supply layer; and a light emitting diode electrically connected with the semiconductor layer. The semiconductor layer may include an oxide semiconductor, and the first oxygen supply layer and the second oxygen supply layer include a metal oxide that includes at least one of indium, zinc, gallium, and tin.

A thickness of the first oxygen supply layer and a thickness of the second oxygen supply layer may be in a range of about 30% to about 50% of a thickness of the semiconductor layer.

The second oxygen supply layer and the gate electrode may have a same planar shape.

The first oxygen supply layer, the second oxygen supply layer, and the semiconductor layer may include a same material.

The first oxygen supply layer and the light blocking layer may have a same planar shape.

A planar shape of the first oxygen supply layer may be different from a planar shape of the light blocking layer.

At least a part of the light blocking layer may not overlap the first oxygen supply layer in a direction that is perpendicular to a surface of the substrate.

The semiconductor layer, the first oxygen supply layer, and the second oxygen supply layer may include an IGZO.

A method for manufacturing a display device according to another embodiment may include forming a light blocking layer on a substrate; forming a first oxygen supply layer on the light blocking layer; forming a buffer layer on the first oxygen supply layer; and forming a semiconductor layer on the buffer layer. The semiconductor layer may include an oxide semiconductor, and the first oxygen supply layer may include a metal oxide that includes at least one of indium, zinc, gallium, and tin.

A thickness of the first oxygen supply layer may be in a range of about 30% to about 50% of a thickness of the semiconductor layer.

A planar area of the first oxygen supply layer may be different from a planar area of the light blocking layer.

The method for manufacturing the display device may further include depositing a gate insulating layer on the semiconductor layer; depositing a second oxygen supply layer on the gate insulating layer; depositing a gate conductive layer on the second oxygen supply layer; and etching the gate insulating layer, the second oxygen supply layer, and the gate conductive layer by using a mask.

According to the embodiments, a display device including an oxygen supply layer, and a method for manufacturing the same can be provided.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
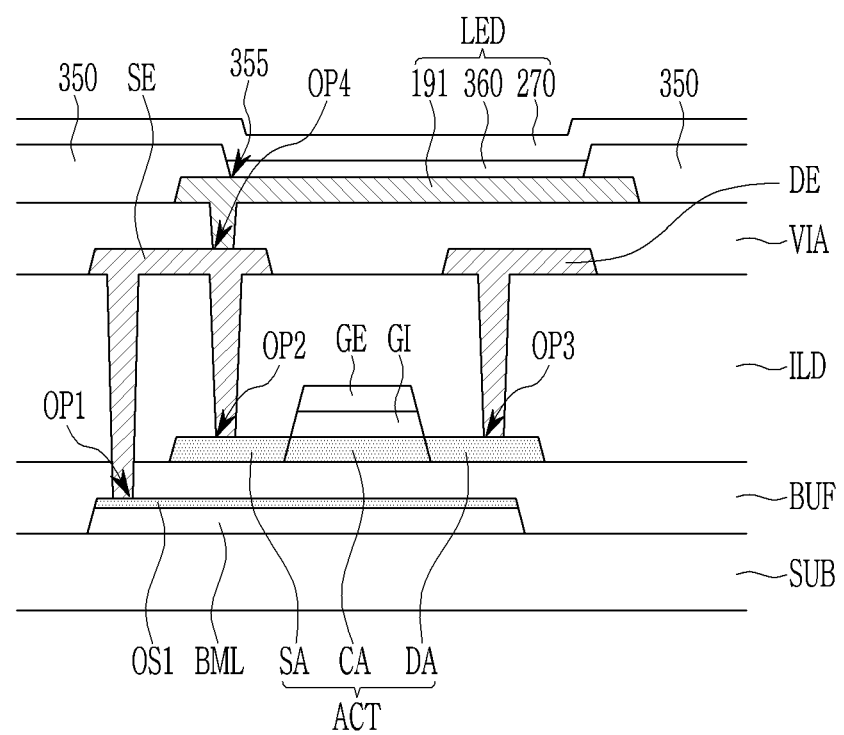
FIG. 1 schematically illustrates a cross-section of a display device according to an embodiment of the invention.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

The drawings and description are to be regarded as illustrative in nature and are not restrictive. Like reference numerals designate like elements throughout the specification.

In the drawings, size and thickness of each element are arbitrarily illustrated for convenience of description, and the disclosure is not necessarily limited to as illustrated in the drawings. In the drawings, the thickness of layers, films, panels, regions, etc., may be exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or one or more intervening elements may also be present. In contrast, when an element is referred to as being "directly on" another element, there are no intervening elements present. Further, throughout the specification, the word "on" a target element will be understood to mean positioned above or below the target element and will not necessarily be understood to mean positioned "at an upper side" based on an opposite to gravity direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, a display device according to an embodiment of the disclosure will be described with reference to the accompanying drawings.

FIG. 1 illustrates a schematic cross-section of a display device according to an embodiment. FIG. 1 simply illustrates a part of the cross-section for better comprehension and ease of description, and the disclosure is not limited thereto.

Referring to FIG. 1, a substrate SUB is provided. The substrate SUB may include at least one of polystyrene, polyvinyl alcohol, poly(methyl methacrylate), polyethersulfone, polyacrylate, polyetherimide, polyethylene naphthalate, polyethylene terephthalate, polyphenylene sulfide, polyarylate, polyimide, polycarbonate, or cellulose triacetate, and cellulose acetate propionate. The substrate SUB may be a rigid substrate, or a flexible substrate that can be bent, folded, and rolled. The substrate SUB may be single-layered or multi-layered. The substrate SUB may be formed by alternately laminating at least one base layer and at least one inorganic layer including sequentially laminated polymer resins.

A light blocking layer BML is disposed on the substrate SUB. The light blocking layer BML may include at least one of aluminum (Al), silver (Ag), magnesium (Mg), gold (Au), nickel (Ni), chromium (Cr), calcium (Ca), molybdenum (Mo), titanium (Ti), tungsten (W), and/or copper (Cu) and a metal oxide and may have a single layer or multi-layer structure including the same.

A first oxygen supply layer OS1 is disposed on the light blocking layer BML. The first oxygen supply layer OS1 may be disposed while directly contacting the light blocking layer BML. As shown in FIG. 1, the first oxygen supply layer OS1 and the light blocking layer BML may have a same planar shape. However, this is only an example, and the planar shape of the first oxygen supply layer OS1 may be different from that of the light blocking layer BML.

The first oxygen supply layer OS1 may be a metal oxide containing indium (In), zinc (Zn), gallium (Ga), or tin (Sn). For example, the oxygen supply layer OS1 may be one of an indium gallium zinc oxide (IGZO), an indium tin oxide (ITO), an indium tin gallium oxide (ITGO), an indium zinc oxide (IZO), a zinc oxide (ZnO), and an indium tin gallium zinc oxide (ITGZO). The first oxygen supply layer OS1 and a semiconductor layer ACT, which will be described below, may include a same material.

Although it will be described in detail below, the first oxygen supply layer OS1 supplies oxygen to the semiconductor layer ACT and can increase the reliability of the semiconductor layer ACT including an oxide semiconductor.

A thickness of the first oxygen supply layer OS1 may be about 30% to about 50% of that of the semiconductor layer ACT. This is a numerical range for adequately supplying oxygen to the semiconductor layer ACT, and in case that the thickness of the first oxygen supply layer OS1 is less than about 30% of that of the semiconductor layer ACT, the first oxygen supply layer OS1 may not adequately supply oxygen to the semiconductor layer ACT, and the semiconductor layer ACT may function as a conductor. In case that the thickness of the first oxygen supply layer OS1 exceeds about 50% of that of the semiconductor layer ACT, an excessive amount of oxygen may be supplied, and thus a threshold voltage of a transistor including the semiconductor layer ACT may be excessively high.

A buffer layer BUF is disposed on the first oxygen supply layer OS1. The buffer layer BUF may include at least one of a silicon oxide ($SiO_x$), a silicon nitride ($SiN_x$), a silicon oxynitride ($SiO_xN_y$), and amorphous silicon (Si).

The buffer layer BUF may include a first opening OP1 that overlaps the first oxygen supply layer OS1 and the light blocking layer BML. In the first opening OP1, a first source/drain (SD) electrode SE may be electrically connected with the first oxygen supply layer OS1 or the light blocking layer BML.

The semiconductor layer ACT is disposed on the buffer layer BUF. The semiconductor layer ACT may include an oxide semiconductor. The oxide semiconductor may include at least one of indium (In), tin (Sn), zinc (Zn), hafnium (Hf), and aluminum (Al). For example, the semiconductor layer ACT may include an indium gallium zinc oxide (IGZO). The semiconductor layer ACT and the first oxygen supply layer OS1 may include a same material.

The semiconductor layer ACT may include a channel area CA that overlaps a gate electrode GE, and a first area SA and a second area DA that are disposed at opposite sides of the channel area CA.

A gate insulating layer GI is disposed on the semiconductor layer ACT. The gate insulating layer GI may include at least one of a silicon oxide ($SiO_x$), a silicon nitride ($SiN_x$), and a silicon oxynitride ($SiO_xN_y$) and may have a single-layered or multi-layered structure including the same.

The gate insulating layer GI may be disposed while overlapping the channel area CA of the semiconductor layer ACT. A gate conductive layer GC (see FIG. 10) that includes the gate electrode GE may be disposed on the gate insulating layer GI. The gate conductive layer GC may include at least one of molybdenum (Mo), aluminum (Al), copper (Cu), titanium (Ti), and a metal oxide and may have a single-layered or multi-layered structure including the same.

The gate electrode GE and the gate insulating layer GI may be formed by a same process and may have a same planar shape. The gate electrode GE may be disposed while overlapping the semiconductor layer ACT in a direction that is perpendicular to a surface of the substrate SUB.

An interlayer insulating layer ILD may be disposed on the semiconductor layer ACT and the gate electrode GE. The interlayer insulating layer ILD may include a silicon oxide ($SiO_x$), a silicon nitride ($SiN_x$), and a silicon oxynitride ($SiO_xN_y$) and may have a single-layered or multi-layered structure including the same. In case that the interlayer insulating layer ILD has a multi-layer structure including a silicon nitride and a silicon oxide, the layer containing the silicon nitride may be disposed closer to the substrate SUB than the layer including the silicon oxide.

The interlayer insulating layer ILD may include a first opening OP1 overlapping the first oxygen supply layer OS1 and the light blocking layer BML, a second opening OP2 overlapping the first area SA of the semiconductor layer ACT, and a third opening OP3 overlapping the second area DA.

A data conductive layer that includes the first SD electrode SE and a second SD electrode DE is disposed on the interlayer insulating layer ILD. The data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu) and a metal oxide and may have a single layer or multi-layer structure including the same.

The first SD electrode SE may contact the first oxygen supply layer OS1 in the first opening OP1 and may contact the first area SA of the semiconductor layer ACT in the second opening OP2. The second SD electrode DE may contact the second area DA of the semiconductor layer ACT in the third opening OP3.

An insulating layer VIA is disposed on the data conductive layer. The insulating layer VIA may include organic insulating materials such as general-purpose polymers such as poly(methyl methacrylate) (PMMA) or polystyrene (PS), polymer derivatives with phenolic groups, acryl-based polymers, imide polymers, polyimide, and siloxane polymers.

The insulating layer VIA may include a fourth opening OP4 that overlaps the first SD electrode SE. A first electrode 191 is disposed on the insulating layer VIA. A partitioning wall 350 may be disposed on the insulating layer VIA and the first electrode 191. The partitioning wall 350 may include an opening 355 that overlaps the first electrode 191. An emission layer 360 may be disposed in the opening 355. A second electrode 270 may be disposed on the partitioning wall 350 and the emission layer 360. The first electrode 191, the emission layer 360, and the second electrode 270 may form a light emitting diode LED.

As described above, the display device according to the embodiment includes the first oxygen supply layer OS1 disposed below the semiconductor layer ACT. In the case of the semiconductor layer ACT including the oxide semiconductor, it may be difficult to use it as a transistor because it exhibits the same properties as a conductor due to an oxygen vacancy therein, or it may not be suitable to be used as a transistor because of its a low threshold voltage. However, in the case of the display device according to an embodiment, since the first oxygen supply layer OS1 supplies oxygen to the semiconductor layer ACT, reliability of the semiconductor layer ACT including the oxide semiconductor can be secured.

Specifically, excessive oxygen included in the first oxygen supply layer OS1 is introduced into the buffer layer BUF due to heat treatment and the like. Excess oxygen supplied to the buffer layer BUF is delivered to the semiconductor layer ACT and is combined with the oxygen vacancy inside the semiconductor layer ACT to eliminate the oxygen vacancy. Accordingly, the oxygen deficiency in the semiconductor layer ACT can be eliminated, and reliability of the transistor including the semiconductor layer ACT can be secured.

Figure 2:
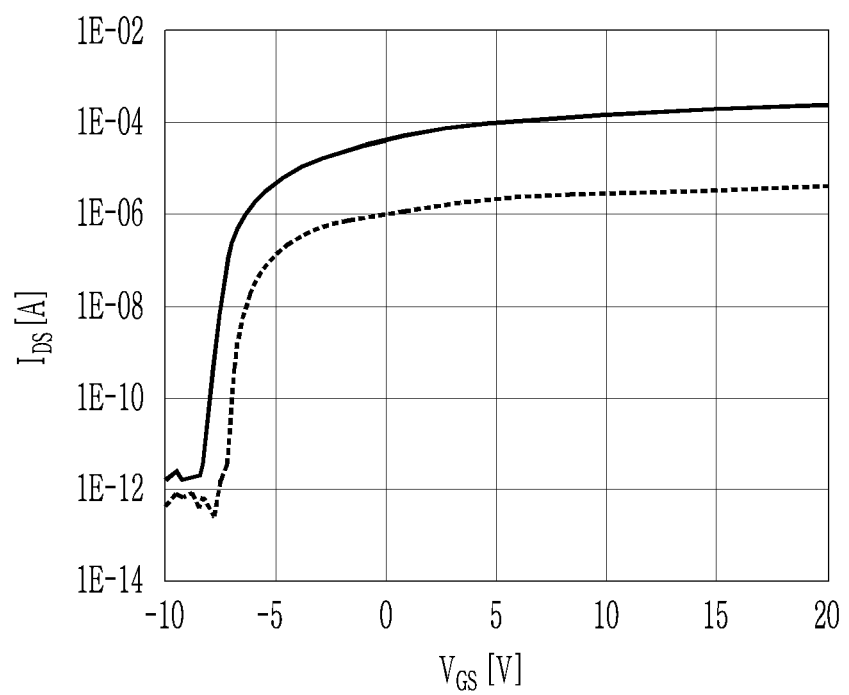
FIG. 2 schematically illustrates a voltage (V)-current (I) graph of a display device that does not include a first oxygen supply layer.

FIG. 2 schematically illustrates a voltage (V)-current (I) graph of a display device that does not include the first oxygen supply layer OS1. Referring to FIG. 2, it can be observed than a threshold voltage appears as low as about −4.35 V.

Figure 3:
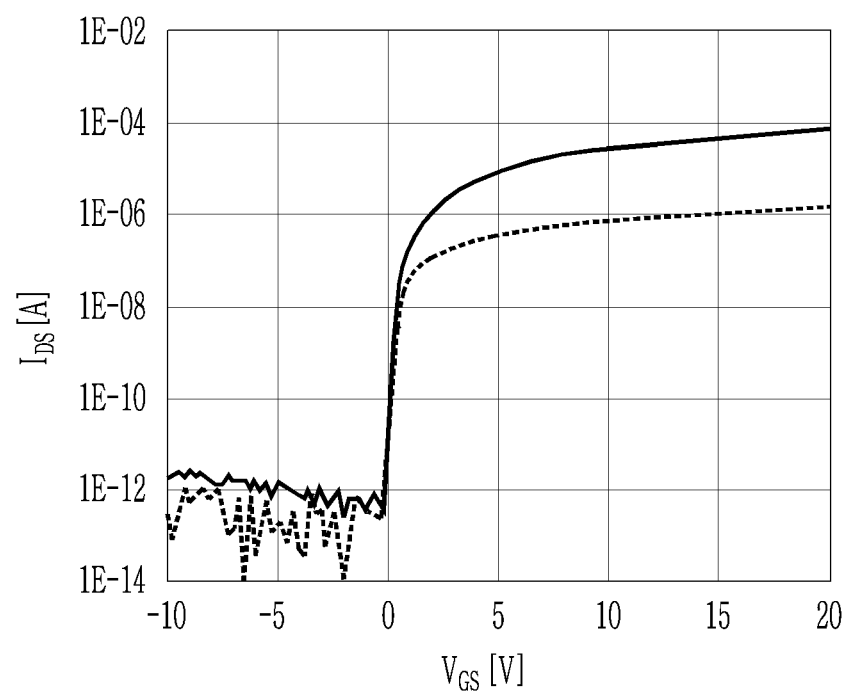
FIG. 3 schematically illustrates a voltage (V)-current (I) graph of the display device that includes the first oxygen supply layer according to the embodiment.

FIG. 3 is a voltage (V)-current (I) graph of the display device that includes the first oxygen supply layer OS1 according to the embodiment. Referring to FIG. 3, it can be observed that a threshold voltage is about 0.09 V in the display device including the first oxygen supply layer OS1. For example, compared to the graph of FIG. 2, it can be seen that the threshold voltage is positively shifted and the display device operates more stably.

Figure 4:
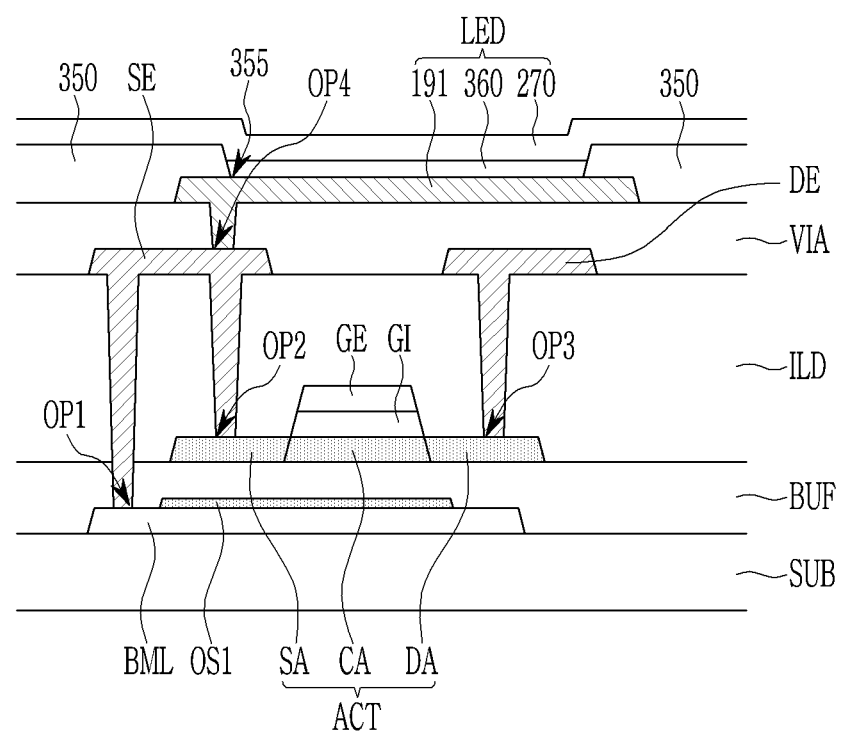
FIG. 4 schematically illustrates a cross-section of a display device according to another embodiment.

FIG. 4 illustrates a cross-section of a display device according to another embodiment. Referring to FIG. 4, a display device according to the embodiment may be different from the embodiment of FIG. 1 at least in a planar shape of a first oxygen supply layer OS1. Repetitive descriptions will be omitted. Referring to FIG. 4, a planar shape of a first oxygen supply layer OS1 is different from a planar shape of a light blocking layer BML. For example, a part of the light blocking layer BML may not overlap the first oxygen supply layer OS1. As shown in FIG. 4, the first SD electrode SE directly overlaps the light blocking layer BML in the first opening OP1 and may not contact the first oxygen supply layer OS1. The area of the first oxygen supply layer OS1 may be appropriately adjusted depending on a material and a threshold voltage of a semiconductor layer ACT.

Figure 5:
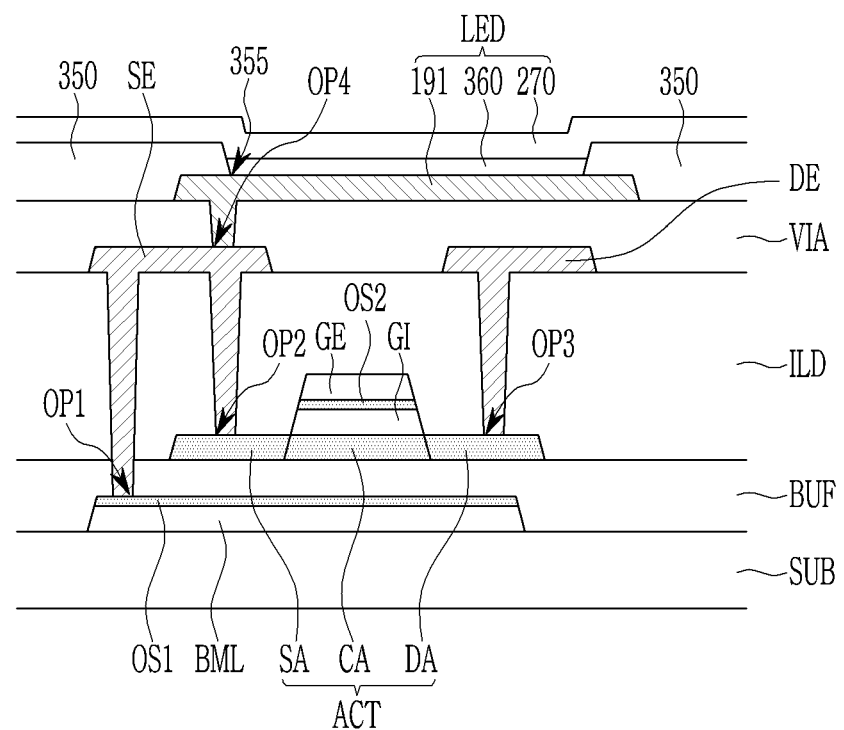
FIG. 5 schematically illustrates a cross-section of a display device according to another embodiment.

FIG. 5 illustrates a cross-section of a display device according to another embodiment. Referring to FIG. 5, a display device according to the embodiment is the same as that according to the embodiment shown in FIG. 1, except that a second oxygen supply layer OS2 disposed between a gate insulating layer GI and a gate electrode GE is further included. Detailed descriptions of the same elements as those of FIG. 1 will be omitted.

A thickness of the second oxygen supply layer OS2 may be about 30% to about 50% of a thickness of the semiconductor layer ACT. This is a numerical range for adequately supplying oxygen to the semiconductor layer ACT, and in case that the thickness of the first oxygen supply layer OS1 is less than about 30% of the thickness of the semiconductor layer ACT, the semiconductor layer ACT may not receive an adequate amount of oxygen, and the semiconductor layer ACT may function as a conductor. In case that the thickness of the second oxygen supply layer OS2 exceeds about 50% of the thickness of the semiconductor layer ACT, an excessive amount of oxygen may be supplied, and thus a threshold voltage of a transistor including the semiconductor layer ACT may be excessively high.

Referring to FIG. 5, the second oxygen supply layer OS2, the gate insulating layer GI, and the gate electrode GE may be formed by a same process and may have a same planar shape. The second oxygen supply layer OS2 may be a metal oxide including indium, zinc, gallium, or tin. For example, the second oxygen supply layer OS2 may include at least one of an IGZO, an ITO, an ITGO, an IZO, a ZnO, and an ITGZO. The first oxygen supply layer OS1, the second oxygen supply layer OS2, and the semiconductor layer ACT may include a same material.

In case that the first oxygen supply layer OS1 and the second oxygen supply layer OS2 are included in the display device, much more oxygen can be supplied to the semiconductor layer ACT.

Figure 6:
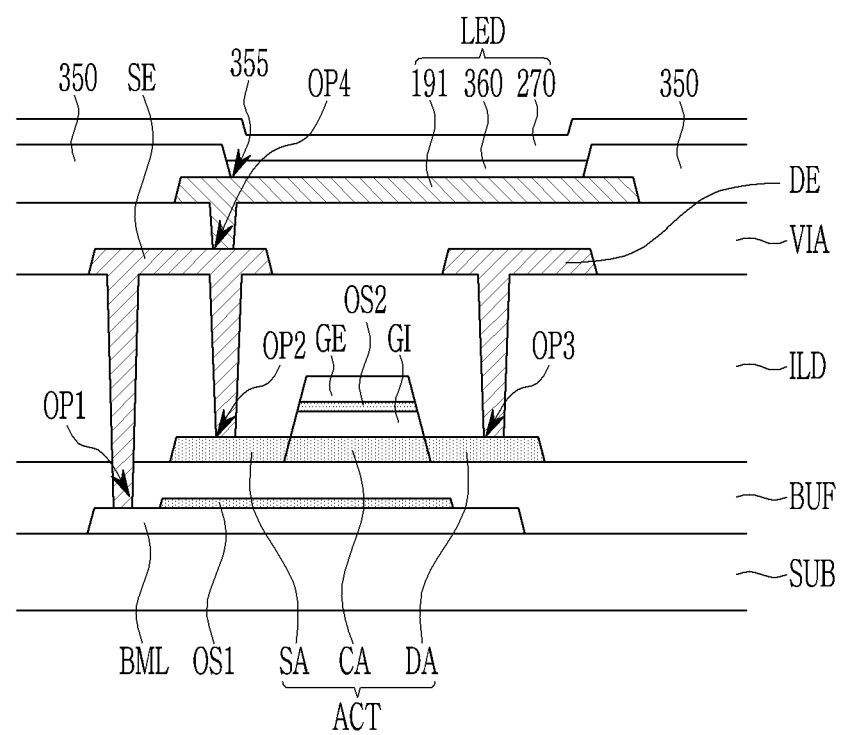
FIG. 6 schematically illustrates a cross-section of a display device according to another embodiment.

FIG. 6 illustrates a cross-section of a display device according to another embodiment. Referring to FIG. 6, a display device according to the embodiment may be different from the embodiment of FIG. 5 at least in a planar shape of a first oxygen supply layer OS1. Repetitive descriptions of the same elements will be omitted. Referring to FIG. 6, a planar shape of a first oxygen supply layer OS1 is different from a planar shape of a light blocking layer BML. For example, a part of the light blocking layer BML may not overlap the first oxygen supply layer OS1. As shown in FIG. 6, a first SD electrode SE overlaps the light blocking layer BML in a first opening OP1 and may not contact the first oxygen supply layer OS1.

Next, a method for manufacturing the display device according to the embodiment of FIG. 1 will be described with reference to FIGS. 7 to 12. FIGS. 7 to 12 are manufacturing process diagrams of the display device according to the embodiment of FIG. 1.

Figure 7:
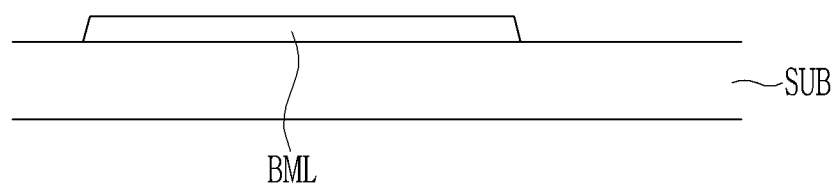
FIG. 7 to FIG. 12 schematically illustrate manufacturing process diagrams of the display device according to the embodiment of FIG. 1.

Referring to FIG. 7, the light blocking layer BML is formed on the substrate SUB. Since materials forming the substrate SUB and the light blocking layer BML have been described above, no further description will be provided. The light blocking layer BML may be formed by dry-etching after depositing the light blocking layer BML material on the substrate SUB.

Figure 8:
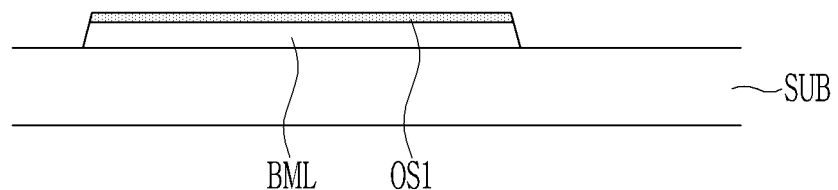

Next, referring to FIG. 8, the first oxygen supply layer OS1 is formed on the light blocking layer BML. Since the material forming the first oxygen supply layer OS1 has been described above, no further description will be provided. The first oxygen supply layer OS1 may be formed through wet etching after depositing the first oxygen supply layer OS1 material on the substrate SUB and the light blocking layer BML. In FIG. 8, the light blocking layer BML and the first oxygen supply layer OS1 have the same planar shape, but this is not restrictive. For example, as shown in FIG. 4, a planar shape of the first oxygen supply layer OS1 may be different from a planar shape of the light blocking layer BML.

Figure 9:
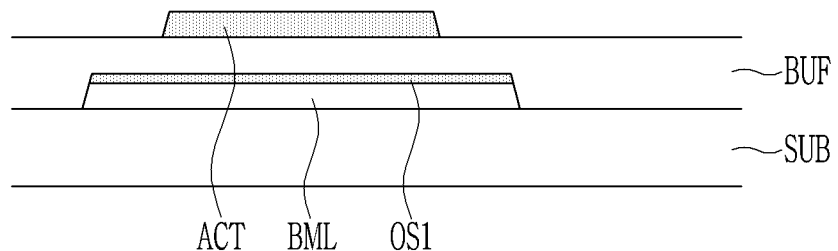

Next, referring to FIG. 9, the buffer layer BUF and the semiconductor layer ACT are formed on the light blocking layer BML and the first oxygen supply layer OS1. Since the material forming the buffer layer BUF and the semiconductor layer ACT have been described above, no further description will be provided. As shown in FIG. 9, the semiconductor layer ACT may be disposed while overlapping the light blocking layer BML in a direction that is perpendicular to a surface of the substrate SUB. The semiconductor layer ACT may be formed by dry-etching after depositing a semiconductor layer ACT material on the buffer layer BUF.

Figure 10:
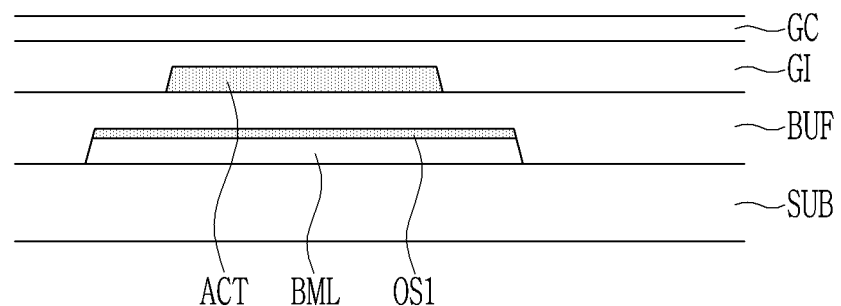

Next, referring to FIG. 10, the gate insulating layer GI and the gate conductive layer GC are formed on the semiconductor layer ACT. Since the material forming the gate insulating layer GI and the gate conductive layer GC have been described above, no further description will be provided.

Figure 11:
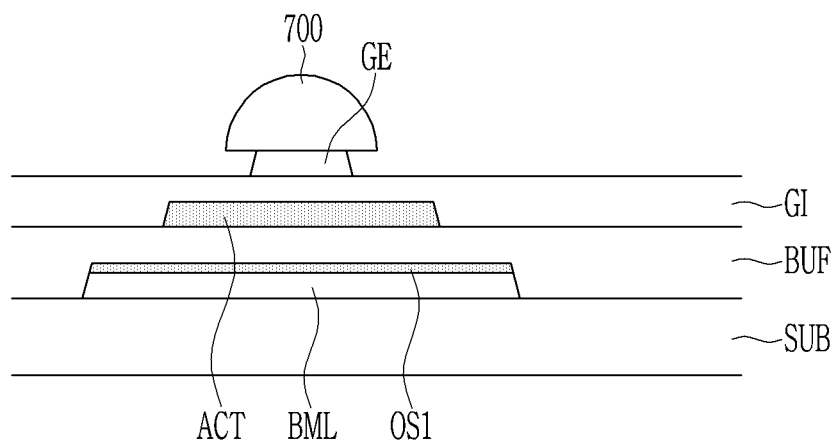

Next, referring to FIG. 11, the gate electrode GE is formed by wet-etching the gate conductive layer GC. The gate insulating layer GI can then be dry-etched by using a photoresist 700 used for etching the gate electrode GE.

Figure 12:
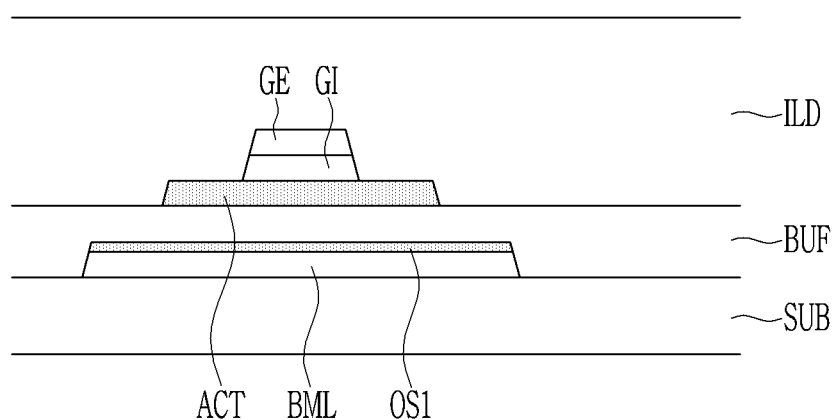

Referring to FIG. 12, the gate insulating layer GI and the gate electrode GE may have a same planar shape. The interlayer insulating layer ILD is formed. The description of the material of the interlayer insulating layer ILD is the same as described above, and thus will be omitted. The main configuration of the present the disclosure is for the first oxygen supply layer OS1, and the subsequent manufacturing process is omitted.

Hereinafter, a method for manufacturing the display device according to the embodiment of FIG. 5 will be described with reference to FIGS. 13 to 18. FIGS. 13 to 18 schematically illustrate manufacturing process diagrams of the display device according to the embodiment of FIG. 5.

Figure 13:
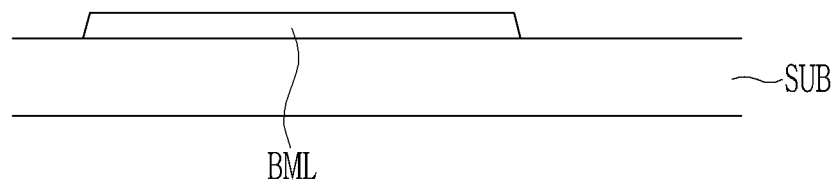
FIG. 13 to FIG. 18 schematically illustrate manufacturing process diagrams of the display device according to the embodiment of FIG. 5.

Referring to FIG. 13, the light blocking layer BML is formed on the substrate SUB. The description of the materials forming the substrate SUB and the light blocking layer BML have been provided above, and therefore repetitive descriptions will not be provided. The light blocking layer BML is formed by dry-etching after depositing the light blocking layer BML material on the substrate SUB.

Figure 14:
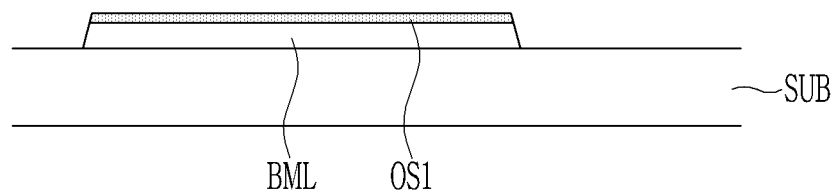

Next, referring to FIG. 14, the first oxygen supply layer OS1 is formed on the light blocking layer BML. The description of the materials forming the first oxygen supply layer OS1 is the same as described above, and thus no further description will be provided. The first oxygen supply layer OS1 may be formed through wet-etching after depositing the first oxygen supply layer OS1 material on the substrate SUB and the light blocking layer BML. In FIG. 14, the light blocking layer BML and the first oxygen supply layer OS1 have a same plane shape is illustrated, but this is not restrictive. For example, as shown in FIG. 6, the planar shape of the first oxygen supply layer OS1 may be different from the planar shape of the light blocking layer BML.

Figure 15:
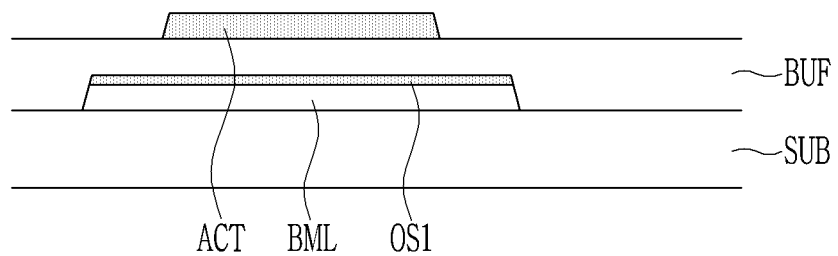

Next, referring to FIG. 15, the buffer layer BUF and the semiconductor layer ACT are formed on the light blocking layer BML and the first oxygen supply layer OS1. The description of the materials forming the buffer layer BUF and semiconductor layer ACT has been provided above, and therefore repetitive descriptions will not be provided. As shown in FIG. 15, the semiconductor layer ACT may overlap the light blocking layer BML in a direction that is perpendicular to a surface of the substrate SUB. The semiconductor layer ACT may be formed by dry-etching after depositing the semiconductor layer ACT material on the buffer layer BUF.

Figure 16:
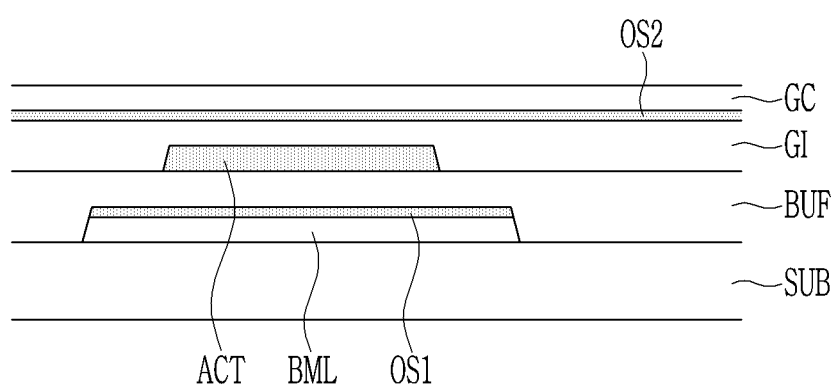

Next, referring to FIG. 16, the gate insulating layer GI, the second oxygen supply layer OS2, and the gate conductive layer GC are formed on the semiconductor layer ACT. The description of the materials forming the gate insulating layer GI, the second oxygen supply layer OS2, and the gate conductive layer GC has been provided above, and therefore repetitive descriptions will not be provided.

Figure 17:
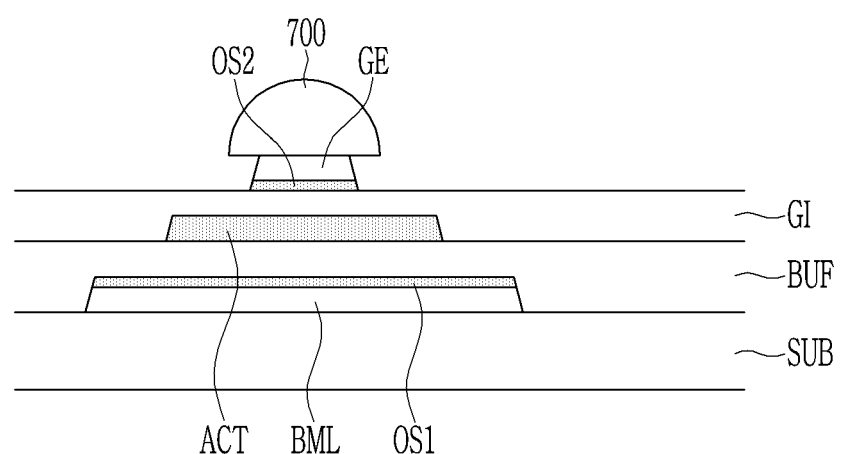

Referring to FIG. 17, the gate conductive layer GC and the second oxygen supply layer OS2 are dry-etched such that the gate electrode GE and the second oxygen supply layer OS2 are formed. The gate conductive layer GC and the second oxygen supply layer OS2 can be collectively etched using a photoresist 700 and may have a same planar shape.

Figure 18:
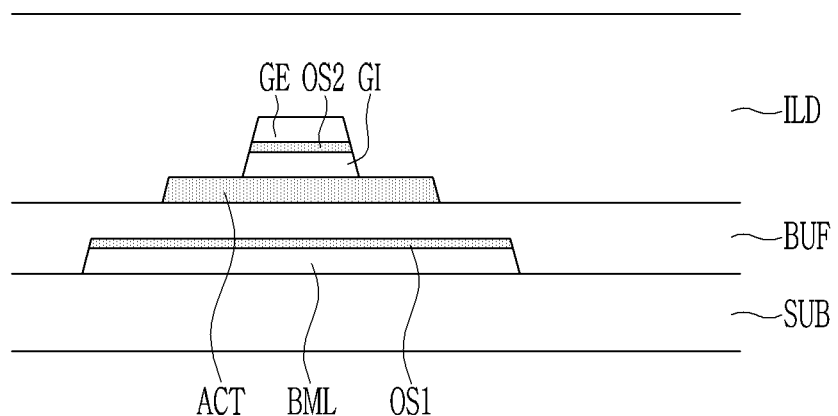

Referring to FIG. 18, the gate insulating layer GI may be dry-etched by using a photoresist 700 used to etch the gate electrode GE and the second oxygen supply layer OS2. Therefore, the gate insulating layer GI, the second oxygen supply layer OS2, and the gate electrode GE may have a same planar shape. Next, the interlayer insulating layer ILD is formed. A material forming the interlayer insulating layer ILD has been described above, and therefore repetitive descriptions will not be provided. The main configuration of the disclosure is for the first oxygen supply layer OS1 and the second oxygen supply layer OS2, and the subsequent manufacturing process is omitted.

In the above, the main features of the disclosure have been described, focusing on a transistor and a light emitting diode electrically connected thereto for better comprehension and ease of description. The display device according to the embodiment may include transistors and capacitors, and an example thereof will be described below.

Figure 19:
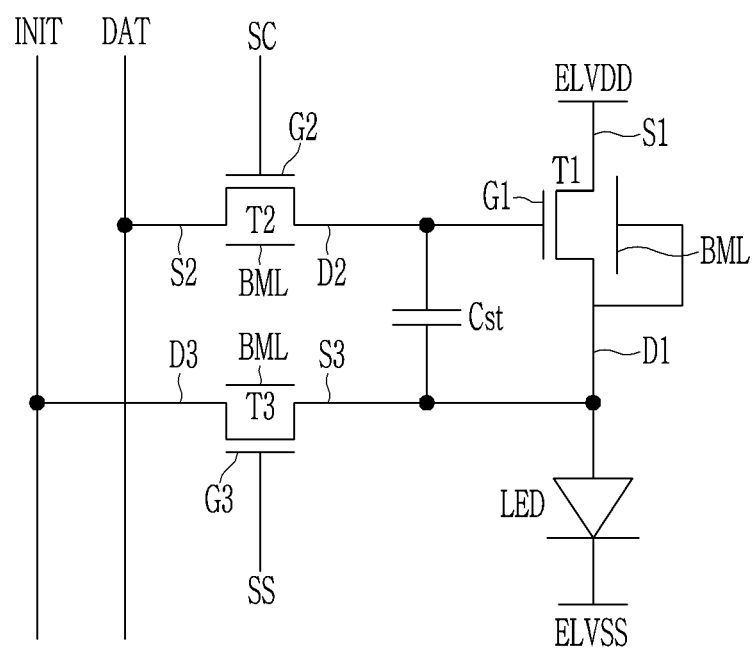
FIG. 19 is a schematic diagram of an equivalent circuit of a pixel of a display device according to an embodiment.

FIG. 19 is a schematic diagram of an equivalent circuit of a pixel of a display device according to an embodiment.

Referring to FIG. 19, a display device according to an embodiment includes pixels, and a pixel may include transistors T1, T2, and T3, a capacitor Cst, and at least one light emitting diode LED. In the embodiment, it will be described as an example that a pixel includes a light emitting diode LED.

The transistors T1, T2, and T3 include a first transistor T1, a second transistor T2, and a third transistor T3. A source electrode and a drain electrode, which will be described below, are provided to distinguish between two electrodes disposed on respective sides of channels of the respective transistor T1, T2, and T3 and the terms may be interchanged.

A gate electrode G1 of the first transistor T1 is electrically connected with an end of the capacitor Cst, a first electrode S1 of the first transistor T1 is electrically connected with a driving voltage line that transmits a driving voltage ELVDD, and a second electrode D1 of the first transistor T1 is electrically connected with an anode of the light emitting diode LED and another end of the capacitor Cst. The first transistor T1 may receive a data voltage DAT according to the switching operation of the second transistor T2 and supply a driving current to the light emitting diode LED according to a voltage stored in the capacitor Cst.

A gate electrode G2 of the second transistor T2 is electrically connected with a first scan line that transmits a first scan signal SC, a first electrode S2 of the second transistor T2 is electrically connected with a data line that can transmit the data voltage DAT or a reference voltage, and a second electrode D2 of the second transistor T2 is electrically connected with the end of the capacitor Cst and the gate electrode G1 of the first transistor T1. The second transistor T2 may be turned on according to the first scan signal SC to transmit the reference voltage or the data voltage DAT to the gate electrode G1 of the first transistor T1 and the end of the capacitor Cst.

A gate electrode G3 of the third transistor T3 is electrically connected with a second scan line that transmits a second scan signal SS, a first electrode S3 of the third transistor T3 is electrically connected with the another end of the capacitor Cst, the second electrode D1 of the first transistor T1, and the anode of the light emitting diode LED, and a second electrode D3 of the third transistor T3 is electrically connected with an initialization voltage line that transmits an initialization voltage INIT. The third transistor T3 is turned on according to the second scan signal SS to transmit the initialization voltage INIT to the anode of the light emitting diode LED and the another end of the capacitor Cst to initialize a voltage of the anode of the light emitting diode LED.

FIG. 19 illustrates that the first scan signal SC and the second scan signal SS have different configurations, but this is merely an example, and the second transistor T2 and the third transistor T3 may be applied with the same scan signal.

The end of the capacitor Cst is electrically connected with the gate electrode G1 of the first transistor T1, and the another end thereof is electrically connected with the first electrode S3 of the third transistor T3 and the anode of the light emitting diode LED. A cathode of the light emitting diode LED is electrically connected with a common voltage line that transmits a common voltage ELVSS.

The light emitting diode LED may emit light according to a driving current generated by the first transistor T1. Each of the transistors T1, T2, and T3 may be disposed while overlapping the light blocking layer BML, and the first transistor T1 may be electrically connected with the light blocking layer BML.

While this disclosure has been described in connection with what is presently considered to be practical embodiments, it is to be understood that the disclosure is not limited to the disclosed embodiments. In contrast, it is intended to cover various modifications and equivalent arrangements included within the spirit and scope of the appended claims.

What is claimed is:

1. A display device comprising:
a light blocking layer disposed on a substrate;
an oxygen supply layer disposed on and contacting the light blocking layer; and
a semiconductor layer disposed on the oxygen supply layer; wherein
the semiconductor layer comprises an oxide semiconductor, and
the oxygen supply layer includes a metal oxide that includes at least one of indium, zinc, gallium, and tin, wherein a thickness of the oxygen supply layer is in a range of about 30% to about 50% of a thickness of the semiconductor layer.

2. The display device of claim 1, further comprising:
a light emitting diode electrically connected with the semiconductor layer.

3. The display device of claim 1, wherein the oxygen supply layer and the semiconductor layer comprise a same material.

4. The display device of claim 1, wherein the oxygen supply layer and the light blocking layer have a same planar shape.

5. The display device of claim 1, wherein a planar shape of the oxygen supply layer is different from a planar shape of the light blocking layer.

6. The display device of claim 1, wherein at least a part of the light blocking layer does not overlap the oxygen supply layer in a direction that is perpendicular to a surface of the substrate.

7. The display device of claim 1, further comprising:
a gate insulating layer disposed on the semiconductor layer; and
a gate electrode disposed on the gate insulating layer.

8. The display device of claim 1, wherein the semiconductor layer and the oxygen supply layer comprise an IGZO.

9. A display device comprising:
a light blocking layer disposed on a substrate;
a first oxygen supply layer disposed on and contacting the light blocking layer;
a semiconductor layer disposed on the first oxygen supply layer;
a gate insulating layer disposed on the semiconductor layer;
a second oxygen supply layer disposed on the gate insulating layer; and
a gate electrode disposed on the second oxygen supply layer; wherein
the semiconductor layer comprises an oxide semiconductor,
the first oxygen supply layer and the second oxygen supply layer comprise a metal oxide that includes at least one of indium, zinc, gallium, and tin, and
a thickness of the first oxygen supply layer and a thickness of the second oxygen supply layer are in a range of about 30% to about 50% of a thickness of the semiconductor layer.

10. The display device of claim 9, further comprising:
a light emitting diode electrically connected with the semiconductor layer.

11. The display device of claim 9, wherein the second oxygen supply layer and the gate electrode have a same planar shape.

12. The display device of claim 9, wherein the first oxygen supply layer, the second oxygen supply layer, and the semiconductor layer comprise a same material.

13. The display device of claim 9, wherein the first oxygen supply layer and the light blocking layer have the same planar shape.

14. The display device of claim 9, wherein a planar shape of the first oxygen supply layer is different from a planar shape of the light blocking layer.

15. The display device of claim 9, wherein at least a part of the light blocking layer does not overlap the first oxygen supply layer in a direction that is perpendicular to a surface of the substrate.

16. The display device of claim 9, wherein the semiconductor layer, the first oxygen supply layer, and the second oxygen supply layer comprise an IGZO.

* * * * *